(12) United States Patent
Mohanraj et al.

(10) Patent No.: US 12,300,557 B2
(45) Date of Patent: May 13, 2025

(54) SEMICONDUCTOR DEVICE INCLUDING DIFFERENTIAL HEIGHT PCB

(71) Applicant: Sandisk Technologies, Inc., Milpitas, CA (US)

(72) Inventors: Nandha Kumar Mohanraj, Bengaluru (IN); Jegathese Dhanachandra Prakash, Bengaluru (IN); Tamilselvan Krishnamoorthy, Bengaluru (IN)

(73) Assignee: Sandisk Technologies, Inc., Milpitas, CA (US)

( * ) Notice: Subject to any disclaimer, the term of this patent is extended or adjusted under 35 U.S.C. 154(b) by 445 days.

(21) Appl. No.: 17/572,344

(22) Filed: Jan. 10, 2022

(65) Prior Publication Data

US 2023/0223307 A1 Jul. 13, 2023

(51) Int. Cl.
*H01L 23/13* (2006.01)
*H01L 23/31* (2006.01)
*H01L 23/498* (2006.01)
*H01L 25/065* (2023.01)

(52) U.S. Cl.
CPC .......... *H01L 23/13* (2013.01); *H01L 23/3121* (2013.01); *H01L 23/49822* (2013.01); *H01L 25/0652* (2013.01); *H01L 2225/06506* (2013.01); *H01L 2225/0651* (2013.01); *H01L 2225/06548* (2013.01); *H01L 2225/06562* (2013.01)

(58) Field of Classification Search
CPC ...................................................... H05K 1/117
See application file for complete search history.

(56) References Cited

U.S. PATENT DOCUMENTS

| 7,235,423 B1 * | 6/2007 | Wang ............... | H05K 3/284 |
| | | | 257/E21.705 |
| 2019/0215970 A1 * | 7/2019 | Lai ............... | H05K 3/288 |

FOREIGN PATENT DOCUMENTS

| JP | 2007133630 A | 5/2007 |
| JP | 2009003969 A | 1/2009 |
| KR | 10-2006-0031580 | 4/2006 |
| KR | 10-2012-0127185 | 11/2012 |
| WO | 2002069251 A1 | 9/2002 |

* cited by examiner

*Primary Examiner* — Yu-Hsi D Sun
(74) *Attorney, Agent, or Firm* — Pearl Cohen Zedek Latzer Baratz LLP

(57) ABSTRACT

A semiconductor device has a differential height substrate including a first section and a second section thinner than the first section. The first section may include contact fingers for electrically coupling the semiconductor device to a connector in a slot of a host device. The second section may include one or more semiconductor dies and other components. Mold compound may encapsulate the semiconductor dies and other components, leaving the contact fingers in the first section of the substrate exposed. A second layer of mold compound may also be applied to a second, uniformly planar surface of the differential height substrate opposite a surface including the one or more semiconductor dies.

19 Claims, 8 Drawing Sheets

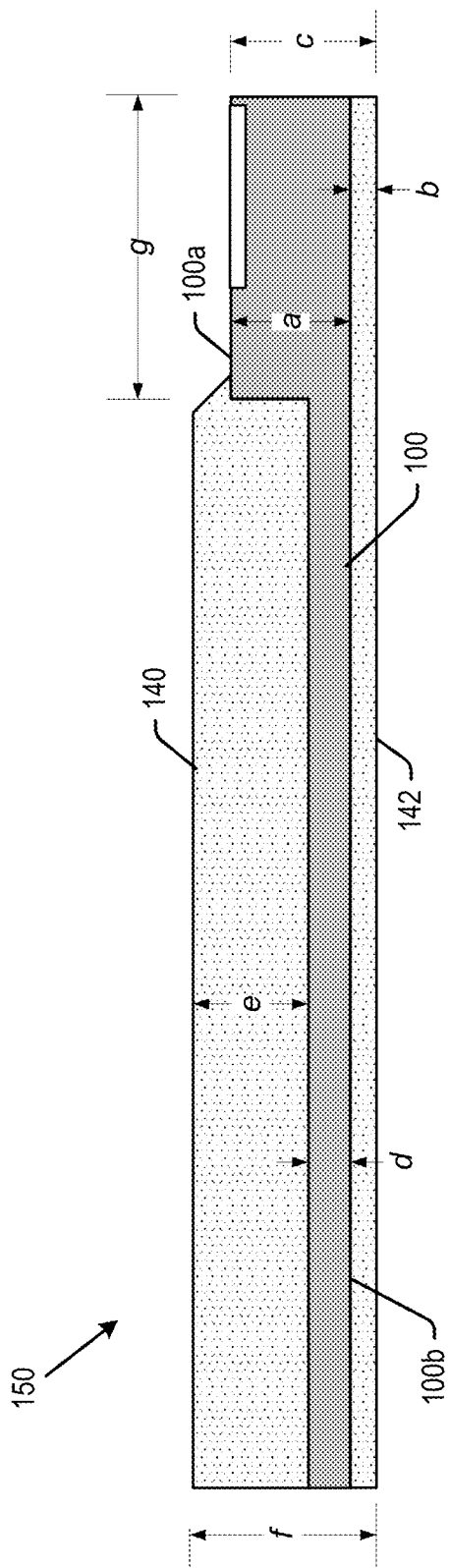

SEMICONDUCTOR DEVICE INCLUDING DIFFERENTIAL HEIGHT PCB

BACKGROUND

The strong growth in demand for portable consumer electronics is driving the need for high-capacity storage devices. Non-volatile semiconductor memory devices, such as flash memory storage cards, are widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, cellular telephones and SSDs (Solid State Drives).

Memory devices are packaged in standard sizes, including for example an SD (Secure Digital) card, where semiconductor dies are mounted on a substrate and then encapsulated in a protective mold compound. The molded package may then be mounted within a plastic lid. The overall thickness of the SD card is set by standard at 2.1±0.15 mm to fit within standard height host slots. Recently, so-called "ribless" memory cards have been developed without the lidding. These memory cards have a first requirement that the overall thickness still be 2.1±0.15 mm, and a second requirement that the area including the contact fingers be 1.4±0.15 mm thick by standard in order for the contact finger to properly mate with the connector pins in the host device.

The resulting ribless memory card therefore conventionally includes a substrate which is 0.21 mm thick and of uniform thickness. The contact fingers are formed on a first surface of the substrate, and the memory dies are mounted on the second, opposed surface of the substrate. Mold compound of uniform thickness is applied to the second surface of the substrate, encapsulating the memory dies, and beneath the contact fingers on the opposed first surface of the substrate. In order to provide the required thickness at the contact fingers, the thickness of the mold compound on the second surface is 1.19 mm, which together with the substrate provides the required thickness at the contact fingers of 1.4 mm. Mold compound having a thickness of 0.7 mm is applied to the first surface of the substrate, leaving the contact fingers exposed. The 0.7 mm thick molding compound on the first surface of the substrate is needed to provide the overall memory card thickness of 2.1 mm, and is otherwise unused space.

Given the ever-present drive toward higher storage capacities in a standard sized memory card, there is a need to find additional space along the height dimension in a memory card to use for increasing storage capacity.

DESCRIPTION OF THE DRAWINGS

FIG. 13 is an edge view of the semiconductor device according to embodiments of the present technology showing exemplary dimensions of the device along the height dimension.

DETAILED DESCRIPTION

Figure 1:
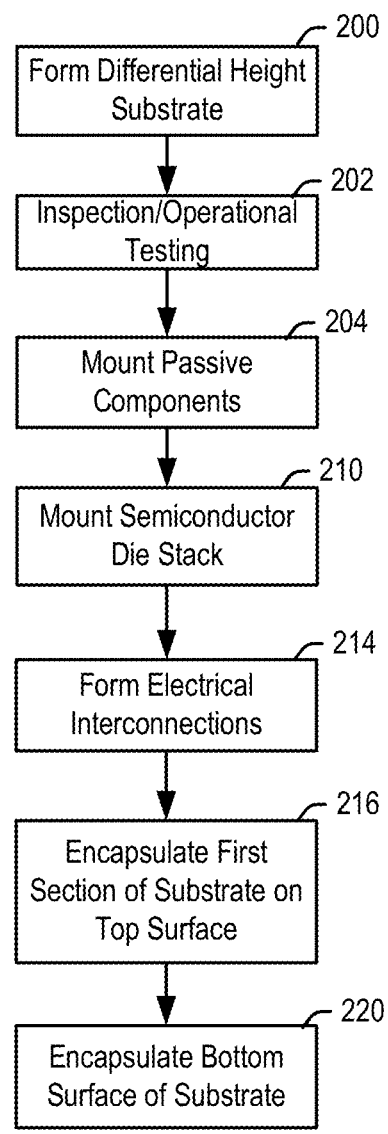
FIG. 1 is a flowchart of the overall fabrication process of a substrate and a semiconductor device using that substrate according to embodiments of the present technology.

The present technology will now be described with reference to the figures, which in embodiments, relate to a semiconductor device including a differential height substrate. In embodiments, the substrate may have a first section including contact fingers, and a second, thinner section extending from the first section. Semiconductor dies and other components may be mounted on the second, thinner section of the substrate. Mold compound may encapsulate the semiconductor dies and other components, leaving the contact fingers in the first section of the substrate exposed. A second layer of mold compound may also be applied to a second, uniformly planar surface of the substrate.

The contact fingers on the first section of the substrate are used to mate with connector pins in a host device to enable transfer to information between the semiconductor device and host device. The thickness of the first substrate section together with the second layer of mold compound on the second surface of the substrate meets the required device thickness of 1.4±0.15 mm. The thickness of the second substrate section together with the first and second layers of mold compound meets the overall required device thickness of 2.1±0.15 mm. By re-engineering the layout of components on the substrate, and by providing the second section of the substrate with a thinner profile than the first section, the space available for memory dies and other components along the height dimension is maximized within the semiconductor device as explained below.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is ±0.15 mm, or alternatively, ±2.5% of a given dimension.

For purposes of this disclosure, a connection may be a direct connection or an indirect connection (e.g., via one or more other parts). In some cases, when a first element is referred to as being connected, affixed, mounted or coupled to a second element, the first and second elements may be directly connected, affixed, mounted or coupled to each other or indirectly connected, affixed, mounted or coupled to each other. When a first element is referred to as being directly connected, affixed, mounted or coupled to a second element, then there are no intervening elements between the first and second elements (other than possibly an adhesive or melted metal used to connect, affix, mount or couple the first and second elements).

An embodiment of the present technology will now be explained with reference to the flowchart of FIG. 1 and the edge and top views of FIGS. 2 through 13. The figures show a single semiconductor device 150 including a differential height substrate 100, or portions thereof, but it is understood that the semiconductor device of the present technology may be assembled from a panel of differential height substrates to achieve economies of scale.

In step 200, a differential height substrate is formed. Details of the layers of the differential height substrate are explained below with reference to the edge views of FIGS. 2-6. Differential height substrate 100 is a signal-carrier medium provided for transferring electrical signals between semiconductor dies mounted on the substrate and a host device, as explained below. In one embodiment of the present technology, the differential height substrate 100 may be a printed circuit board, but the substrate 100 may be formed of other signal-carrier mediums such as flex tapes, interposers or combinations thereof.

Figure 2:
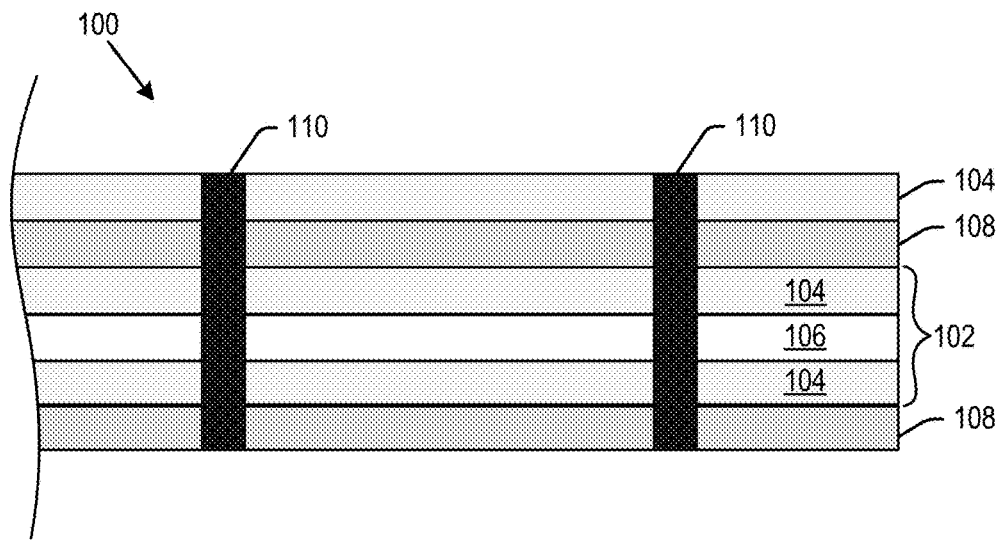
FIGS. 2-6 are detailed edge views showing the layers of the differential height substrate of a semiconductor device at different stages of fabrication according to an embodiment of the present technology.

Referring now to the edge view of FIG. 2, the substrate 100 may start in step 200 with a signal carrier assembly 102 comprised of conductive layers 104 sandwiching a dielectric core 106. The conductive layers 104 may be formed of copper or copper alloys, plated copper or plated copper alloys, Alloy 42 (42Fe/58Ni), copper plated steel, or other metals and materials suitable for use on substrate panels. The core 106 may be formed of various dielectric materials such as for example, polyimide laminates, epoxy resins including FR4 and FR5, bismaleimide triazine (BT), and the like. The core 106 may be ceramic or organic in alternative embodiments.

The signal carrier assembly 102 may in turn be sandwiched between a pair of b-stage prepreg layers 108, and a conductive layer 104 may be formed on an upper surface of the upper prepreg layer 108. The prepreg layers 108 in the substrate are added to help adhere layers of the substrate together and to provide additional electrical insulation between layers. Through hole vias 110 may be formed through the layers and plated or filled with conductive material to selectively electrically couple the various conductive layers 104 to each other. The number and position of the vias 110 are shown by way of example only and may vary in further embodiments.

Figure 3:
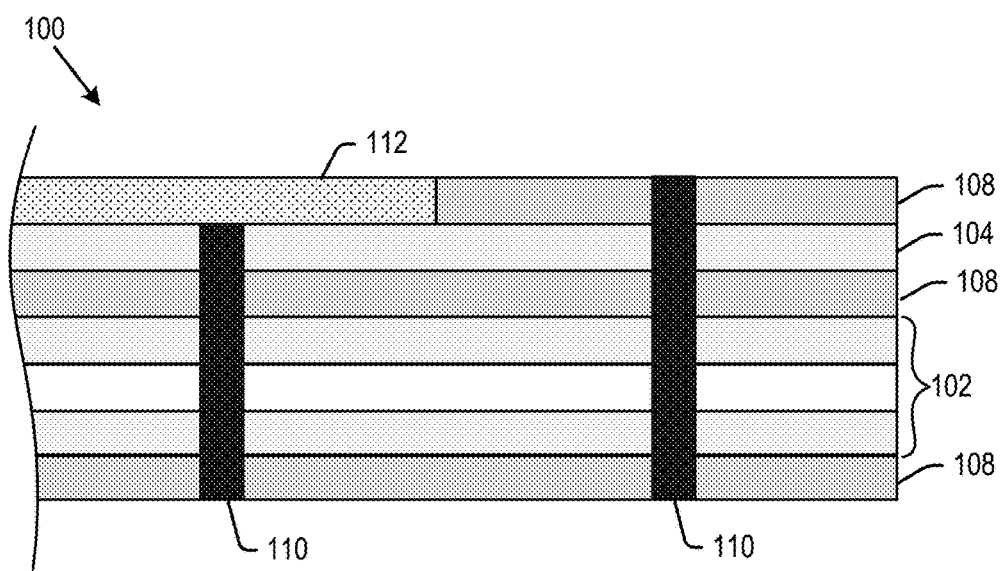

Referring to the edge view of FIG. 3, a further b-stage prepreg layer 108 may be added on top of the upper conductive layer 104. This prepreg layer 108 may extend only part way across the surface of the upper conductive layer 104 to form an opening, or window, on the upper surface. That window may be filled with solder mask 112.

Figure 4:
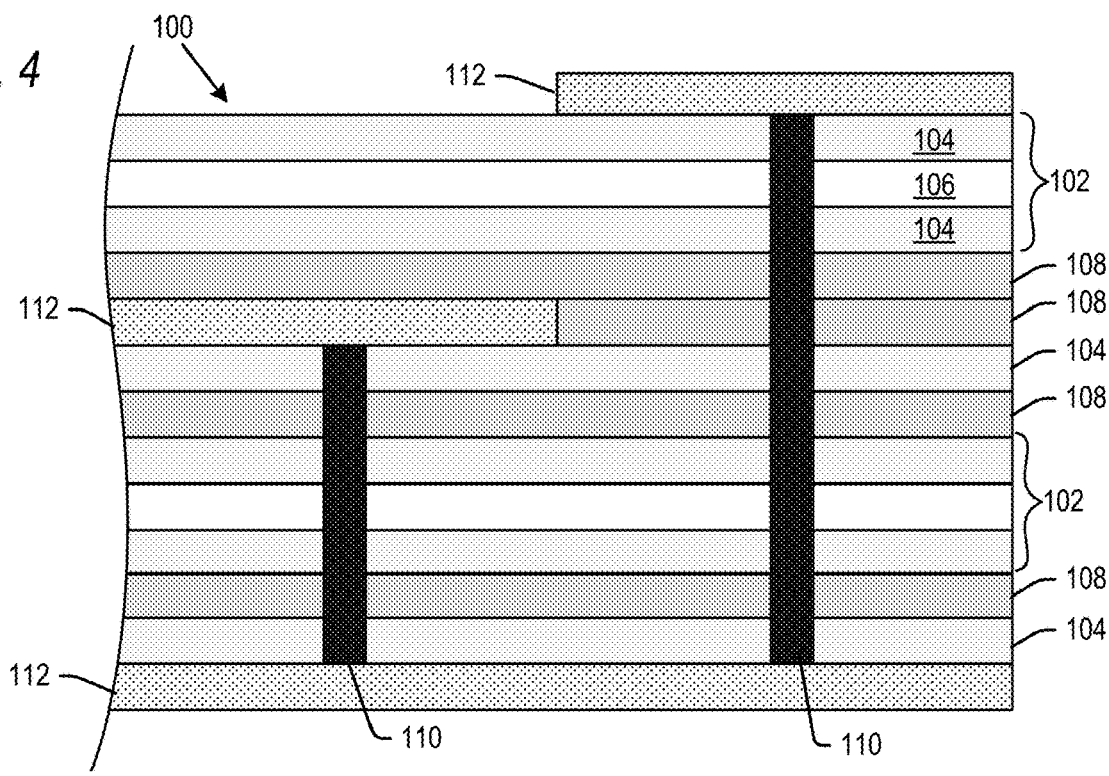

Next, referring to the edge view of FIG. 4, another signal carrying assembly 102 may be added on top of the existing structure. First, another b-stage prepreg layer 108 may be added on top of the previously uppermost layer of prepreg and solder mask. Then, the signal carrying assembly 102 may be added, including a pair of conductive layers 104 sandwiching a dielectric core 106. A final solder mask layer 112 may then be added on top of the structure. At the bottom of the structure, another conductive layer 104 may be added below the previously bottommost layer of prepreg 108, and then a solder mask layer may be added beneath the new conductive layer 104. The vias 110 may be extended downward through the newly added conductive layer 104 as shown.

Figure 5:
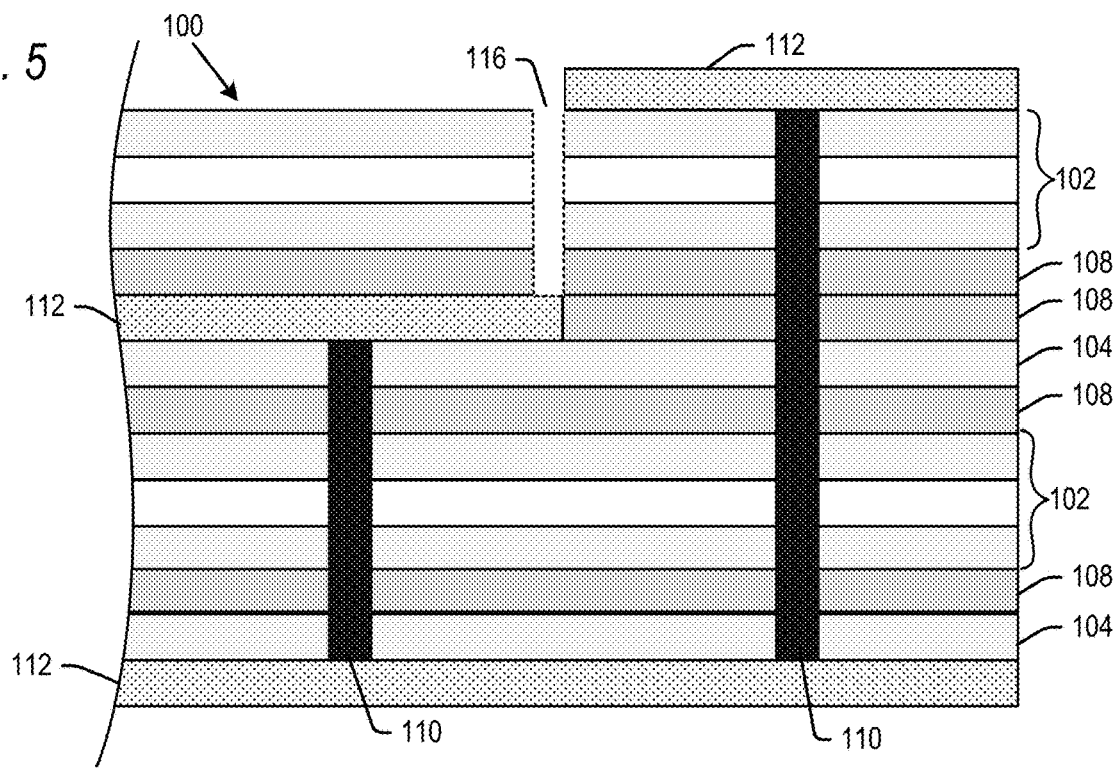
Figure 6:
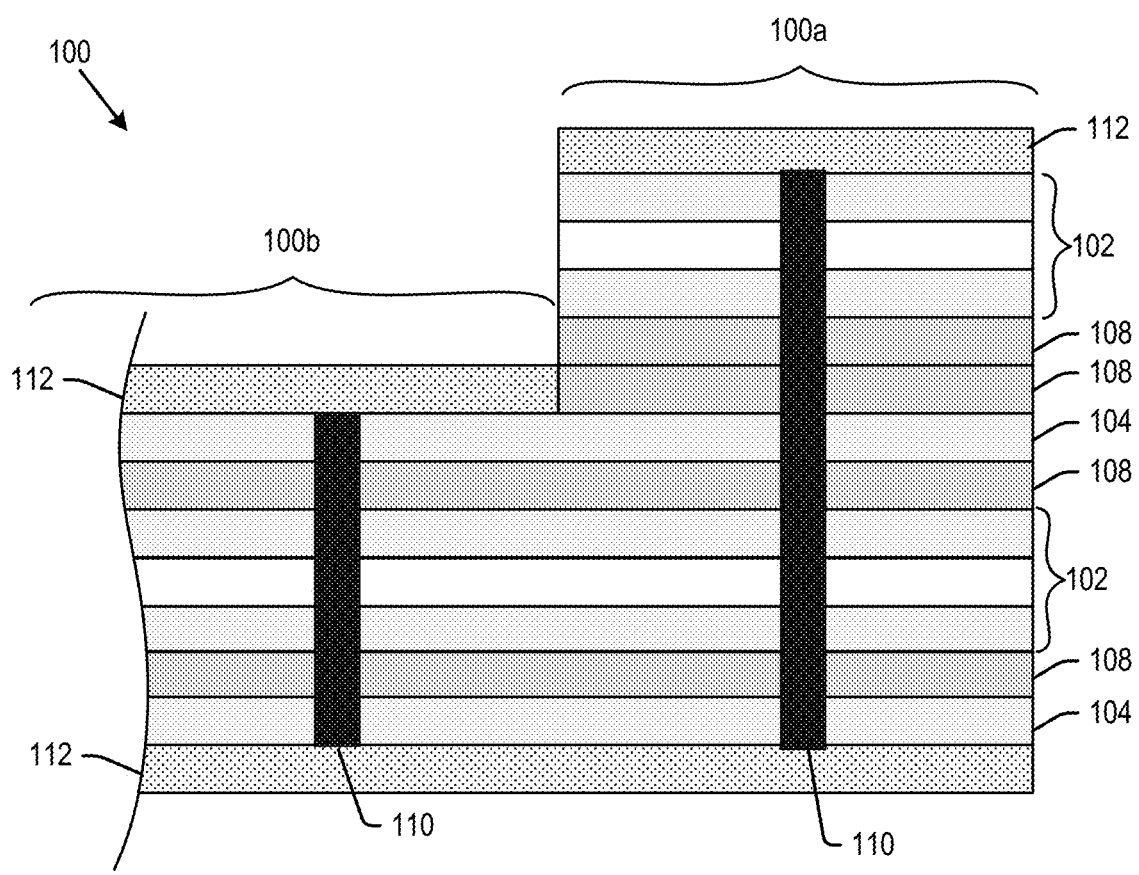

As seen in the edge view of FIG. 5, the substrate 100 may then be depth routed at 116 to create a vertically planar opening across the substrate (into the page of FIG. 5). The upper layers above the window filled with solder mask 112 (to the left of opening 116 from the perspective of FIG. 5) may then be removed in a de-cap process. FIG. 6 is an edge view of a portion of the finished substrate 100, showing a first section 100a having more layers and being thicker than a second section 100b. The first section 100a and the second section 100b are contiguous with each other.

Figure 7:
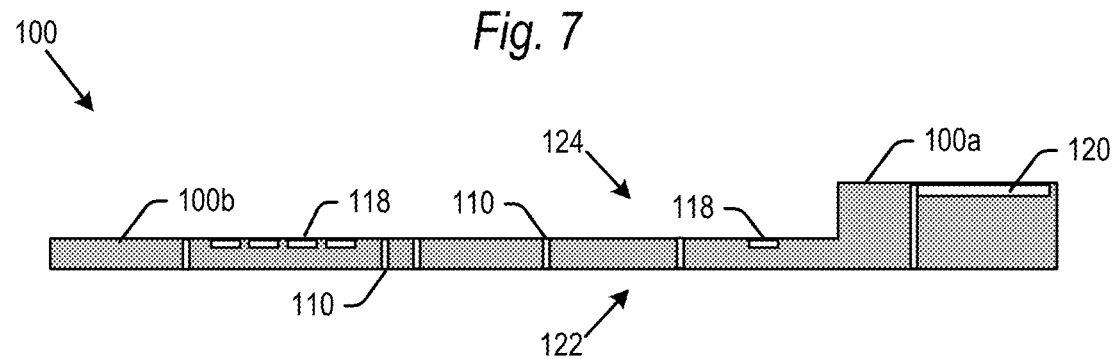
FIG. 7 is a generalized edge view of the differential height substrate of a semiconductor device according to an embodiment of the present technology.
Figure 8:
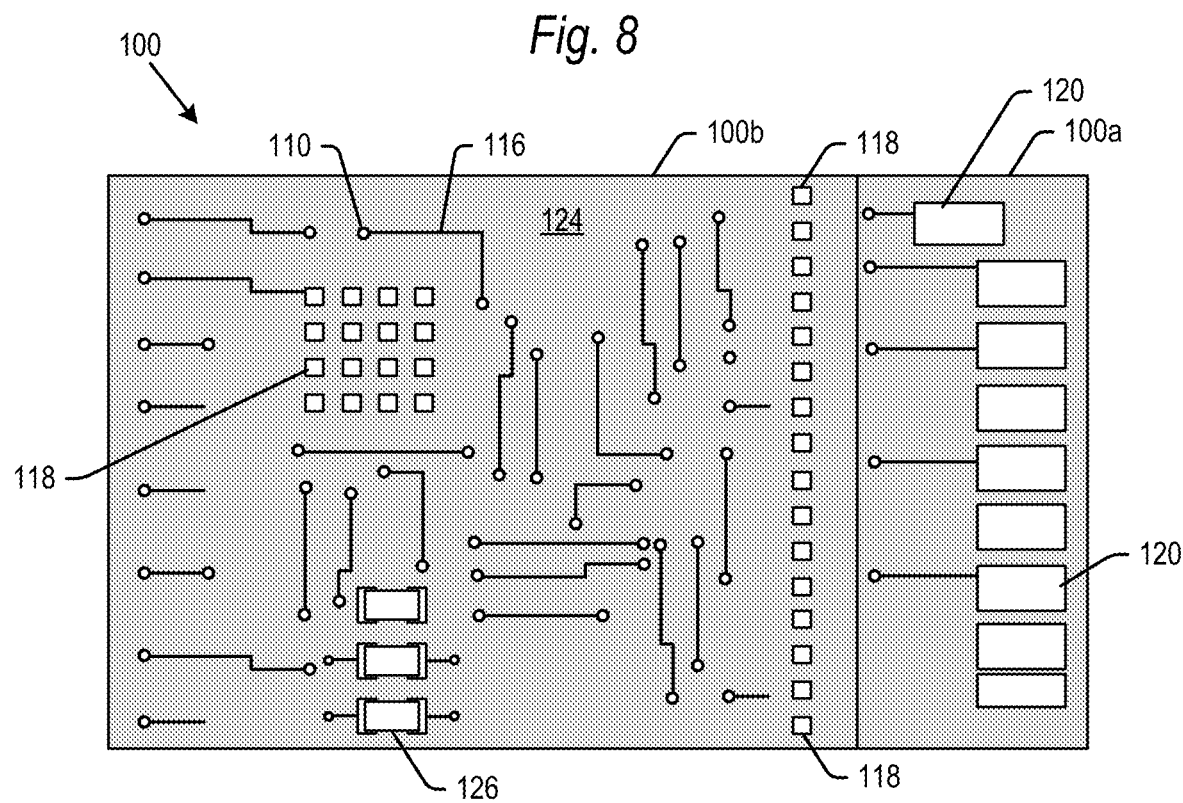
FIG. 8 is a top view of the substrate of FIG. 7.

FIGS. 7 and 8 are edge and top views, respectively, of the completed substrate 100. Prior to application of the final top and bottom solder mask layers 112, the top and bottom conductive layers 104 may each be individually etched to form conductance patterns comprising electrical traces 116, contact pads 118 and contact fingers 120 (the solder mask layer 112 is omitted from FIGS. 7 and 8 for clarity). One or more of the interior conductive layers 104 may also be etched to include conductance patterns of traces 116 (not shown). The contact pads 118 are provided to receive wire bonds and/or surface mounted components such as semiconductor dies as explained below. The contact fingers 120 are used to connect the completed semiconductor device to socket pins of a host device as explained below. The top and/or bottom solder mask layers may be etched to expose the contact pads 118 and contact fingers 120. The substrate 100 may include a bottom surface 122 which is flat and planar, and a top surface 124 which includes differential height sections 100a and 100b. Each of the sections 100a and 100b may also be flat and planar, at different elevations. The pattern of vias 110, traces 116, contact pads 118 and contact fingers 120 shown in FIGS. 7 and 8 is by way of example only and each may vary in further embodiments.

Referring again to FIG. 1, the completed differential height substrate 100 may be inspected and operationally tested in step 202. These inspections may for example include an automatic optical inspection (AOI), an automated visual inspection (AVI) and/or a final visual inspection (FVI) to check for defects, contamination, scratches and discoloration. One or more of these steps may be omitted or performed in a different order in further embodiments.

Assuming the differential height substrate 100 passes inspection, passive components 126 (FIG. 8) may next be affixed to the top surface 124 of the second substrate section 100b in a step 204. The one or more passive components may include for example one or more capacitors, resistors and/or inductors, though other components are contemplated. The passive components 126 shown are by way of example only, and the number, type and position may vary in further embodiments.

Figure 9:
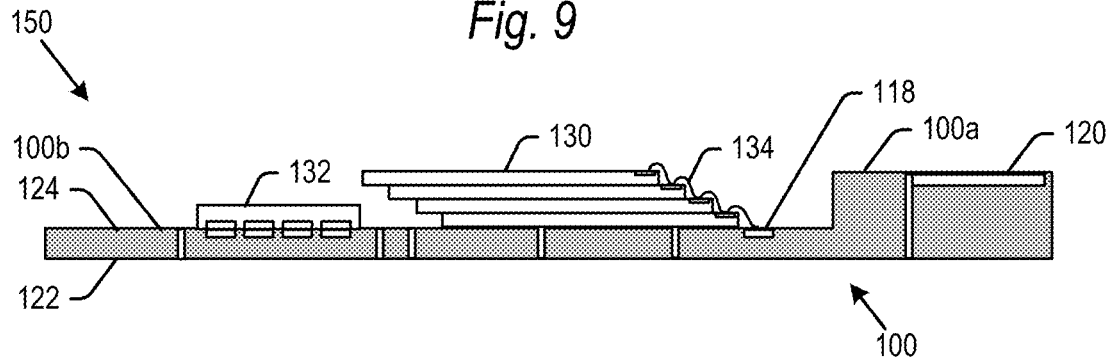
FIG. 9 is an edge view of the differential height substrate including semiconductor dies mounted thereon according to an embodiment of the present technology.
Figure 10:
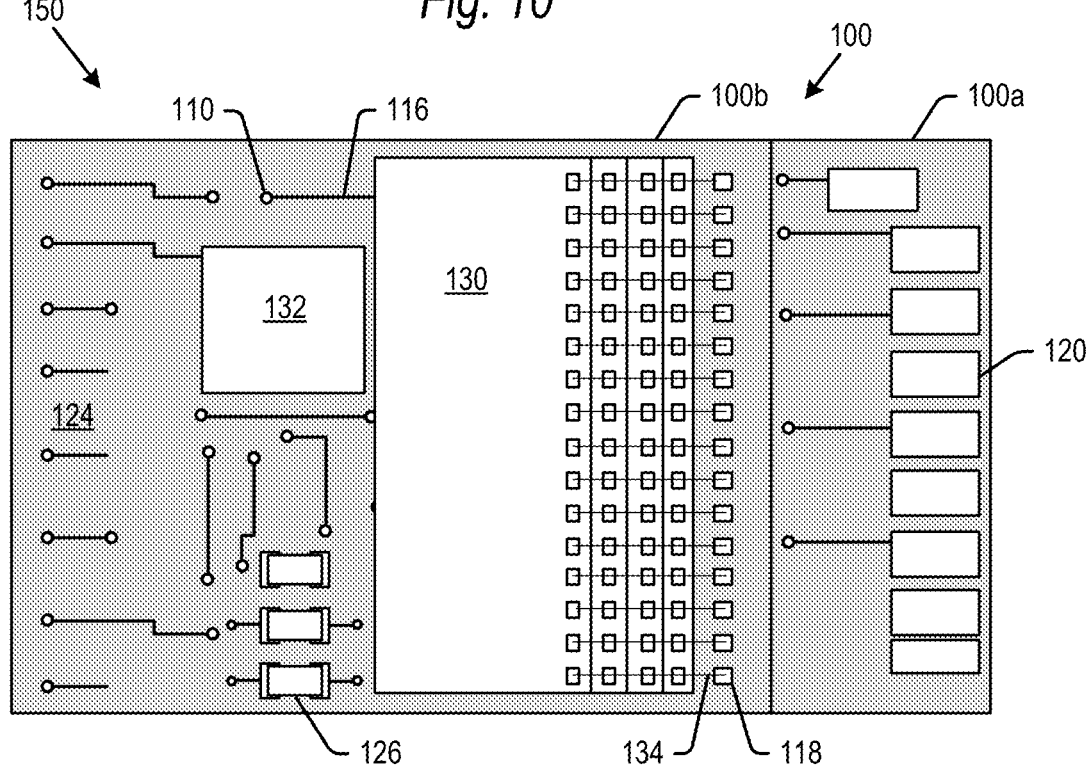
FIG. 10 is a top view of the substrate of FIG. 9.
Figure 11:
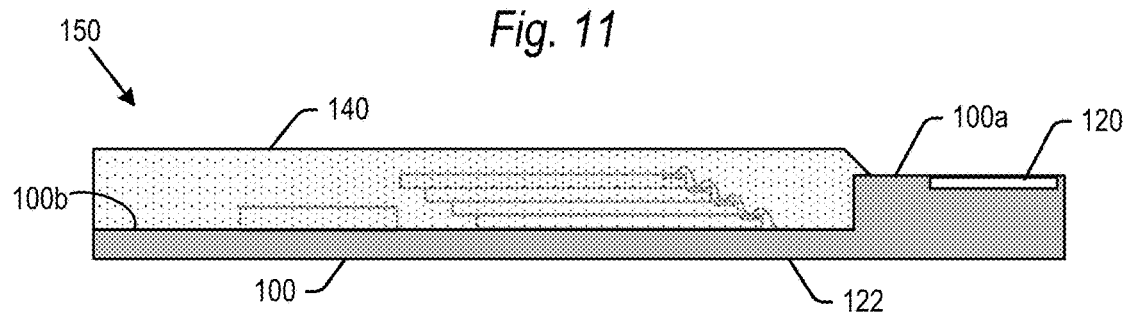
FIG. 11 is an edge view of the semiconductor device according to embodiments of the present technology including a first layer of mold compound encapsulating the semiconductor dies on a first surface of the differential height substrate.
Figure 12:
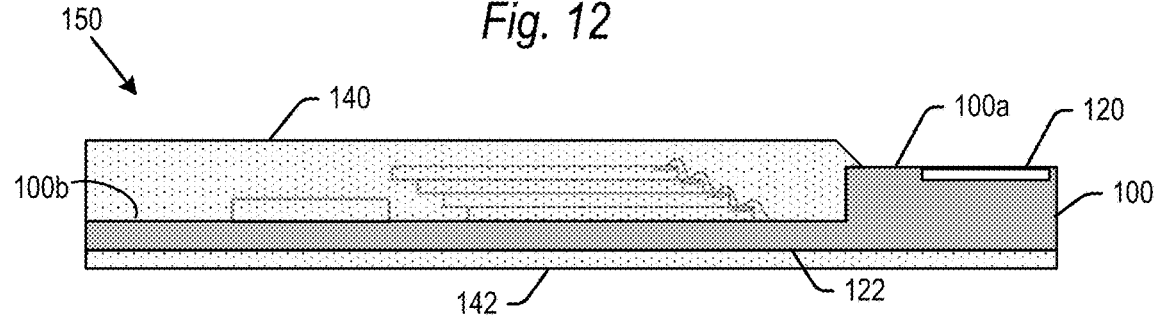
FIG. 12 is an edge view of the semiconductor device according to embodiments of the present technology including a second layer of mold compound encapsulating a second surface of the differential height substrate.

In step 210, one or more semiconductor dies 130, 132 may be mounted on the top surface 124 of the second section 100b of the substrate 100. As shown in the edge and top views of FIGS. 9 and 10, respectively, the semiconductor dies 130 may for example be one or more memory dies such as 2D NAND flash memory or 3D BiCS (Bit Cost Scaling), V-NAND or other 3D flash memory, but other types of dies 130 may be used. These other types of semiconductor dies include but are not limited to RAM such as an SDRAM, DDR SDRAM, LPDDR and GDDR.

Where multiple semiconductor dies 130 are included, the semiconductor dies 130 may be stacked atop each other in an offset stepped configuration to form a die stack as shown in FIGS. 9 and 10. The number of dies 130 shown in the stack is by way of example only, and embodiments may include different numbers of semiconductor dies, including for example 1, 2, 4, 8, 16, 32 or 64 dies. There may be other numbers of dies in further embodiments. The dies may be affixed to the substrate and/or each other using a die attach film. As one example, the die attach film may be cured to a B-stage to preliminarily affix the dies 130 in the stack, and subsequently cured to a final C-stage to permanently affix the dies 130 to the substrate 100.

FIGS. 9 and 10 also show a semiconductor die 132 which may for example be a controller die surface mounted to the differential height substrate 100. Controller die 132 may for example be an ASIC for controlling transfer of signals and data to and from the memory dies 130. The controller die 132 may be flip-chip mounted to contact pads 118 by soldering or Cu-to-Cu bonding. The controller die 132 may alternatively be wire bonded as explained in the following paragraph.

In step 214, the semiconductor memory dies 130 may be electrically interconnected to each other and to the contact pads 118 of the differential height substrate 100. FIGS. 9 and 10 show bond wires 134 being formed between corresponding die bond pads on respective dies 130 down the stack, and then bonded to contact pads 118 on the second section 100b of the top surface 124 of the differential height substrate 100. The wire bonds may be formed by a ball-bonding technique, but other wire bonding techniques are possible. The semiconductor dies 130 may be electrically interconnected to each other and the substrate 100 by other methods in further embodiments, including by through-silicon vias (TSVs) and flip-chip technologies. As noted, when not surface mounted, the controller die 132 may also be wire bonded the substrate in step 214. The semiconductor dies 130, 132 are electrically coupled to the contact fingers 120 through the traces 116 and vias 110 of the substrate 100.

Following electrical connection of the dies 130, 132 to the substrate 100, the semiconductor device 150 may undergo a first encapsulation process in step 216. As shown in the edge view of FIG. 11, a mold compound 140 may be applied over the components on the top surface 124 at the second substrate section 100b to encapsulate and protect the passive components 126 and the semiconductor dies 130, 132. The mold compound 140 leaves the contact fingers 120 on the first substrate section 100a uncovered and exposed. Mold compound 140 may include for example solid epoxy resin, Phenol resin, fused silica, crystalline silica, carbon black and/or metal hydroxide. Other mold compounds from other manufacturers are contemplated. The mold compound may be applied by various known processes, including by FFT (flow free thin) molding, compression molding, transfer molding or injection molding techniques.

The semiconductor device 150 may next undergo a second encapsulation process in step 220 to complete assembly of the semiconductor device 150. As shown in the edge view of FIG. 12, a mold compound 142 may be uniformly applied over the entire flat planar bottom surface 122. The mold compound 142 may be the same or different material used for mold compound 140, and the mold compound 142 may be applied using the same or different process as that used to apply mold compound 140. In the above description, mold compound 142 was applied to the bottom surface 122 after the mold compound 140 was applied to the top surface 124. However, in further embodiments, mold compound 142 may be applied before mold compound 140, or the mold compounds 140 and 142 may be applied simultaneously in a single encapsulation process combining steps 216 and 220. As noted below, the mold compound 142 on the bottom surface 122 may be omitted altogether in further embodiments.

As explained in the Background section, conventional memory cards had an inefficient design which included unused mold compound space (provided to meet the height requirement of the card), and which unnecessarily limited the amount of space on the substrate, along the height dimension, for mounting memory dies. It is an advantage of the present technology to solve this problem by re-engineering the layout of components on the substrate and by providing a differential height substrate. Using this design, the space available on the top substrate surface 124 (at the second substrate section 100b) for memory dies is maximized. Additionally, the required thickness of the semiconductor device 150 at the contact fingers 120 is maintained.

FIG. 13 illustrates exemplary dimensions of the semiconductor device 150 of the present technology. For example, the thickness, a, of the first substrate section 100a may be 1.2 mm, and the thickness, b, of the bottom mold compound layer 142 may be 0.2 mm. This provides the thickness, c, of the semiconductor device 150 at the contact fingers 120 at 1.4 mm, as required by standard. The thickness, d, of the second substrate section 100b may be 0.4 mm. The thickness, e, of the top mold compound layer 140 may be 1.5 mm. Thus, the combined thickness, f of the second substrate section 100b and the top and bottom mold compounds 140, 142 may be 2.1 mm, as required by standard. The length, g, of the first substrate section 100a may be at least as great as the space required for the contact fingers 120, which in embodiments may range between 7.65 mm to 13.4 mm. It is understood that each of the above dimensions is provided by way of example, and each may vary in further embodiments, for example ±0.15 mm.

It is noted that the 1.5 mm available within the mold compound 140 on the top surface 124 for memory dies is significantly larger than the space along the height dimension available in conventional memory cards. Thus, the semiconductor device 150 of the present technology may provide larger storage capacity as compared to conventional memory cards of the same form factor.

In a further embodiment, the bottom mold compound layer 142 may be omitted. This allows the thickness of the top mold compound layer 140, and the space available for additional memory dies, to be increased, for example to 1.7±0.15 mm. In such an embodiment, the thickness of the first substrate section 100a may be increased to 1.4 mm to meet the standard.

In embodiments described above, the semiconductor device 150 may be a lidless SD (Secure Digital) flash memory card. However, it is understood that the semiconductor device 150 may be other types of memory cards, both of standard and non-standard form factors, and that the semiconductor devices 150 may be lidless or lidded. Where lidded, the semiconductor device 150 may be housed in a plastic lid. In such embodiments, the thickness of the mold compound 140 and/or 142 may be reduced to accommodate the thickness of the lid.

In summary, in one example, the present technology relates to a semiconductor device, comprising: a substrate comprising: a first section comprising contact fingers configured to electrically couple the semiconductor device to contact pins in a host device, the first section having a first thickness, and a second section having a thinner profile than the first section; one or more semiconductor dies mounted on the second section of the substrate and electrically coupled to the contact fingers in the first section of the substrate; and mold compound encapsulating the one or more semiconductor dies on the second section, the mold compound leaving the contact fingers uncovered and exposed.

In another example, the present technology relates to a semiconductor device, comprising: a differential height substrate, comprising: a first planar surface, a second surface opposed to the first surface, a first section wherein the second surface is at a first elevation, and a second section wherein the second surface is at a second elevation lower than the first elevation, and contact fingers provided on the second surface in the first section, the contact fingers configured to electrically couple the semiconductor device to contact pins in a host device; one or more semiconductor dies mounted on the second surface in the second section and electrically coupled to the contact fingers in the first section of the differential height substrate; and mold compound on the second surface in the second section encapsulating the one or more semiconductor dies.

In a further example, the present technology relates to a semiconductor device configured to fit within a slot of a host device, comprising: one or more semiconductor dies; signal carrier means for transferring signals between the one or more semiconductor dies and the host device, the signal carrier means comprising: a first section comprising contact fingers configured to electrically couple the semiconductor device to contact pins in the host device, the first section having a first thickness, and a second section having a thinner profile than the first section; and mold compound encapsulating the one or more semiconductor dies on the second section, the mold compound leaving the contact fingers uncovered and exposed.

The foregoing detailed description of the technology has been presented for purposes of illustration and description. It is not intended to be exhaustive or to limit the technology to the precise form disclosed. Many modifications and variations are possible in light of the above teaching. The described embodiments were chosen in order to best explain the principles of the technology and its practical application to thereby enable others skilled in the art to best utilize the technology in various embodiments and with various modifications as are suited to the particular use contemplated. It is intended that the scope of the technology be defined by the claims appended hereto.

We claim:

1. A semiconductor device, comprising:
   a substrate comprising:
      a first section comprising contact fingers configured to electrically couple the semiconductor device to a connector of a host device, the first section having a first thickness, and
      a second section having a second thickness thinner than the first thickness;
   one or more semiconductor dies mounted on the second section of the substrate and electrically coupled to the contact fingers in the first section of the substrate; and
   mold compound encapsulating the one or more semiconductor dies on the second section, the mold compound leaving the contact fingers uncovered and exposed;
   wherein the substrate comprises a first flat planar surface and a second surface, opposed to the first surface, comprising differential heights of the first and second sections.

2. The semiconductor device of claim 1, wherein the first section is contiguous with the second section.

3. The semiconductor device of claim 1, wherein the contact fingers and one or more semiconductor dies are mounted on a same side of the substrate.

4. The semiconductor device of claim 1, wherein the mold compound comprises a first layer of mold compound applied to a first side of the substrate, and a second layer of mold compound applied to a second side of the substrate opposed to the first side.

5. The semiconductor device of claim 1, wherein the contact fingers are provided on the first section on the second surface of the substrate.

6. The semiconductor device of claim 1, wherein the one or more semiconductor dies are provided on the second section on the second surface of the substrate.

7. The semiconductor device of claim 1, wherein the mold compound comprises a first layer of mold compound applied to the second surface of the substrate, and a second layer of mold compound applied to the first surface of the substrate.

8. The semiconductor device of claim 1, wherein the semiconductor device is a Secure Digital memory card.

9. The semiconductor device of claim 8, wherein the Secure Digital memory card is lidless.

10. The semiconductor device of claim 9, wherein the first section has a thickness of 1.2±0.15 mm, the second section has a thickness of 0.4±0.15 mm and the mold compound has a thickness of 1.5±0.15 mm.

11. The semiconductor device of claim 10, wherein the mold compound comprises a first layer of mold compound applied to a first side of the substrate, and a second layer of mold compound applied to a second side of the substrate opposed to the first side, the second layer of mold compound having a thickness of 0.2±0.15 mm.

12. A semiconductor device, comprising:
   a differential height substrate, comprising:
      a first flat planar surface,
      a second surface opposed to the first surface, the second surface comprising first and second sections comprising differential heights;
      contact fingers provided on the second surface in the first section, the contact fingers configured to electrically couple the semiconductor device to contact pins in a host device;
   one or more semiconductor dies mounted on the second surface in the second section and electrically coupled to the contact fingers in the first section of the differential height substrate; and
   mold compound on the second surface in the second section encapsulating the one or more semiconductor dies.

13. The semiconductor device of claim 12, wherein the one or more semiconductor dies comprise a plurality of flash memory dies stacked on the second surface in the second section of the differential height substrate.

14. The semiconductor device of claim 13, wherein the one or more semiconductor dies further comprise a controller die on the second surface in the second section of the differential height substrate.

15. The semiconductor device of claim 12, wherein the semiconductor device is a lidless Secure Digital memory card.

16. The semiconductor device of claim 15, wherein the mold compound comprises a first layer of mold compound, and a second layer of mold compound applied to the first planar surface of the differential height substrate.

17. The semiconductor device of claim 16, wherein the differential height substrate at the second section, together with the first and second layers of mold compound have a combined thickness of 2.1±0.15 mm.

18. The semiconductor device of claim 17, wherein the differential height substrate at the first section, together with the second layer of mold compound has a combined thickness of 1.4=0.15 mm.

19. A semiconductor device configured to fit within a slot of a host device, comprising:
   one or more semiconductor dies;
   signal carrier means for transferring signals between the one or more semiconductor dies and the host device, the signal carrier means comprising:
      a first section comprising contact fingers configured to electrically couple the semiconductor device to contact pins in the host device, the first section having a first thickness, and
      a second section having a second thickness less than the first thickness; and
   mold compound encapsulating the one or more semiconductor dies on the second section, the mold compound leaving the contact fingers uncovered and exposed;
   wherein the signal carrier means comprises a first flat planar surface and a second surface, opposed to the first surface, comprising differential heights of the first and second sections.

* * * * *